United States Patent [19]
Ishimura et al.

[11] Patent Number: 5,521,869
[45] Date of Patent: May 28, 1996

[54] SEMICONDUCTOR MEMORY WITH IMPROVED TRANSFER GATE DRIVERS

[75] Inventors: Tamihiro Ishimura; Sampei Miyamoto, both of Tokyo, Japan

[73] Assignee: OKI Electric Industry Co., Ltd., Tokyo, Japan

[21] Appl. No.: 351,117

[22] Filed: Nov. 30, 1994

Related U.S. Application Data

[62] Division of Ser. No. 25,677, Mar. 3, 1993, Pat. No. 5,394,374.

[30] Foreign Application Priority Data

Mar. 13, 1992 [JP] Japan ..................... 4-054702

[51] Int. Cl.⁶ ................ H03K 19/017; H03K 17/06
[52] U.S. Cl. ................ 365/189.01; 365/204; 365/196; 365/189.11; 365/203
[58] Field of Search ................ 365/203, 189.11, 365/230.01, 222, 230.06, 196, 230.08, 204

[56] References Cited

U.S. PATENT DOCUMENTS

| | | | |
|---|---|---|---|
| 4,733,373 | 3/1988 | Murotari | 365/203 |
| 5,177,708 | 1/1993 | Furutari et al. | 365/203 |
| 5,255,235 | 10/1993 | Miyatake | 365/203 |
| 5,270,967 | 12/1993 | Moazzami et al. | 365/222 |
| 5,351,215 | 9/1994 | Tanabe | 365/203 |
| 5,394,374 | 2/1995 | Ishimura et al. | 365/230.06 |
| 5,400,291 | 3/1995 | Naritake et al. | 365/230.01 |
| 5,412,,604 | 5/1995 | Fukuda et al. | 365/189.11 |
| 5,418,753 | 5/1995 | Seki | 365/222 |

*Primary Examiner*—Viet Q. Nguyen
*Attorney, Agent, or Firm*—Spencer & Frank

[57] ABSTRACT

A semiconductor memory has a sense amplifier array shared by first and second memory cell arrays, which are selected by first and second selection signals. Interconnections between the sense amplifier array and the first memory cell array are controlled by a first transfer gate signal. When the first selection signal is inactive, the second selection signal is coupled through a first transfer gate driver to become the first transfer gate signal. When the first selection signal is active, the first transfer gate signal is decoupled from the second selection signal and driven to an elevated level.

11 Claims, 12 Drawing Sheets

SEMICONDUCTOR MEMORY WITH IMPROVED TRANSFER GATE DRIVERS

This is a Division of application Ser. No. 08/025,677 filed Mar. 3, 1993, allowed Sep. 1, 1994, as U.S. Pat. No. 5,394,374.

BACKGROUND OF THE INVENTION

This invention relates to a semiconductor memory, more particularly to the circuits for generating transfer gate signals in a semiconductor memory with shared sense amplifiers.

To conserve power and obtain an adequate operating margin, the memory cells in a semiconductor memory are commonly divided into a plurality of arrays, only one of which is activated in any given access cycle. This leads to a configuration in which sense amplifier arrays are disposed between memory cell arrays, with each sense amplifier array shared by the memory cell arrays on either side. Transfer gate signals control interconnections between the memory cell arrays and sense amplifier arrays.

In the standby state, to precharge bit lines in the memory cell arrays, it suffices to drive the transfer gate signals to the supply voltage level. During an access cycle, however, the transfer gate signals associated with the accessed memory cell array must be driven to a higher level, to enable writing or refreshing of data at the full supply-voltage level.

Prior-art semiconductor memories of this type accordingly provide, for each transfer gate signal, a transfer gate driver having a charge pump for generating an elevated voltage. In densely integrated memories, in which each transfer gate signal must drive the gate capacitance of a large number of gate transistors, the charge pump requires a large capacitor, so the transfer gate drivers take up considerable space. Moreover, they must be located at some distance from the sense amplifier arrays, a requirement that lengthens the transfer gate signal lines and increases their resistance and capacitance.

Prior-art transfer gate drivers also rely on delay lines for timing control. These delay lines are a source of various problems, such as inefficient charge pumping or unwanted current flow from the power supply to ground. These problems occur when the timing is improperly adjusted, as a result of fabrication variations, for example.

SUMMARY OF THE INVENTION

It is accordingly an object of the present invention to reduce the size of transfer gate signal drivers in a semiconductor memory.

Another object of the invention is to eliminate timing problems in transfer gate signal drivers.

The invented memory is powered by two potentials Vss and Vcc, and generates an elevated potential Vpp such that Vcc is intermediate between Vpp and Vss. The memory has a sense amplifier array coupled to two memory cell arrays. Decoders generate first and second selection signals that select these memory cell arrays, the selection signals having an active level of Vss and an inactive level of Vcc.

When the first selection signal is inactive, the second selection signal is coupled through a first transfer gate driver to become a first transfer gate signal, controlling interconnections between the sense amplifier array and the first memory cell array. The first transfer gate signal is therefore at the Vcc level when neither memory cell array is selected, and at the Vss level when the second memory cell array is selected.

When the first selection signal is active, the first transfer gate driver decouples the first transfer gate signal from the second selection signal and drives the first transfer gate signal to the Vpp level.

DETAILED DESCRIPTION OF THE INVENTION

Figure 1:
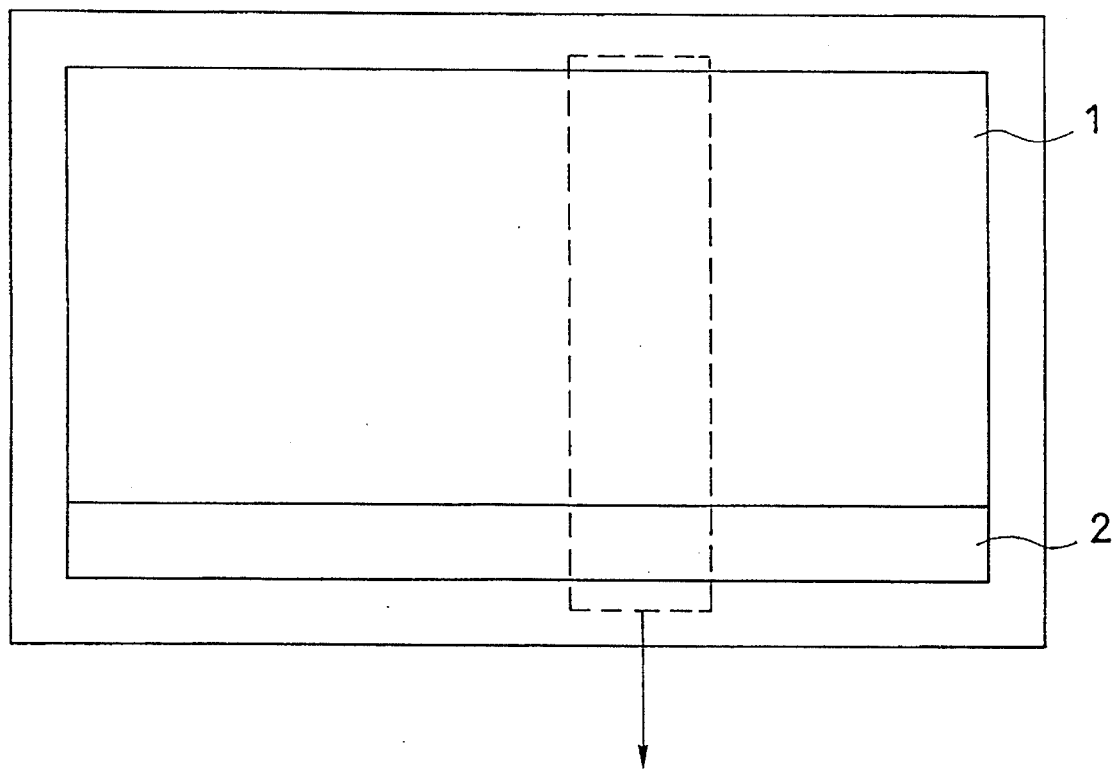
FIG. 1 is a general plan view of a semiconductor memory device.

The invention will now be described in more detail with reference to the attached drawings. These drawings illustrate the invention but do not restrict its scope, which should be determined solely from the appended claims.

For the sake of brevity, n-channel and p-channel metal-oxide-semiconductor field-effect transistors will be referred to as NMOS and PMOS transistors, respectively, and voltage levels occurring in the description and claims will be indicated by the symbols Vss, Vcc, and Vpp. Vss denotes the zero-volt power-supply level or ground potential, and is indicated in the drawings by the usual symbol for ground. Vcc denotes tho supply-voltage level. Vpp denotes an elevated voltage level, one such that Vcc is intermediate between Vss and Vpp, and such that Vpp–Vcc exceeds the threshold voltage of the NMOS transistors to which Vpp will be applied. That is, $Vpp > Vcc + Vtn$ where Vtn is the NMOS transistor threshold value. The voltage levels denoted by Vpp need not all be the same, as long as they all satisfy the above inequality.

Referring now to FIG. 1, the invented semiconductor memory has a memory matrix 1 comprising memory cells and sense amplifiers, and a control circuit 2 that controls access to the memory cells. The memory matrix 1 is divided into a plurality of arrays as illustrated in FIG. 2, which shows the portion of FIG. 1 enclosed in the dotted line.

Figure 2:
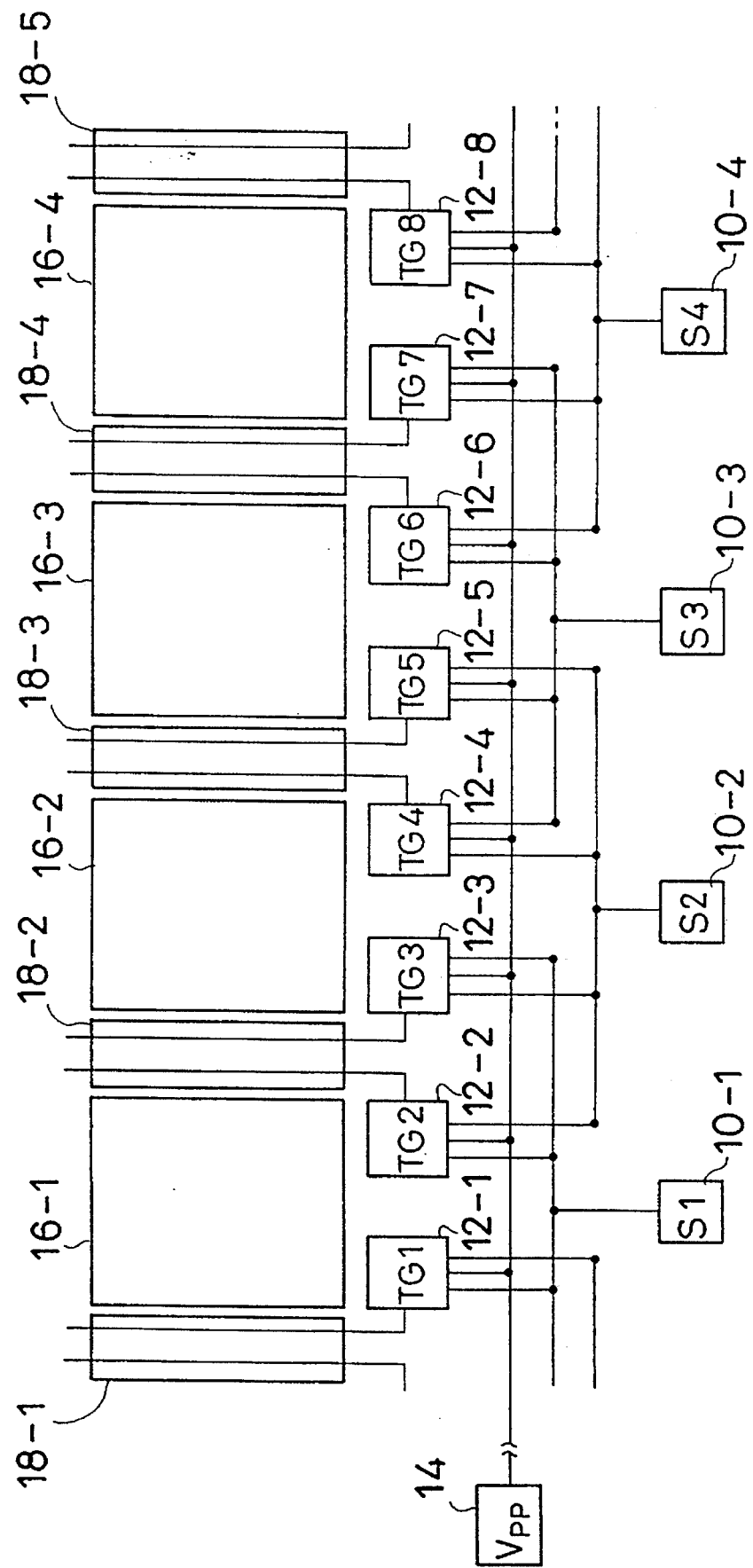
FIG. 2 is a block diagram illustrating part of the semiconductor memory in FIG. 1.

Referring to FIG. 2, the memory cell arrays are selected by a plurality of decoders 10-1, 10-2, . . . that receive address signals (not indicated in the drawing) and generate selection signals S1, S2, . . . . These selection signals are normally inactive, the inactive level being the Vcc level. To select the i-th memory cell array, decoder 10-i takes selection signal Si to the Vss level, which is the active level.

The selection signals are furnished to a plurality of transfer gate drivers 12-1, 12-2, . . . , which also receive Vpp from a Vpp source 14, and generate transfer gate signals TG1, TG2, . . . . The drawing shows a single Vpp source 14 supplying Vpp to all of the transfer gate drivers 12-1, 12-2, . . . , but this is not a restriction. The invention can obviously be practiced with other Vpp sourcing arrangements, such as a separate Vpp source 14 for each transfer gate driver 12-1, 12-2, . . . , for example.

Disposed between the memory cell arrays 16-1, 16-2, . . . are sense amplifier arrays 18-1, 18-2, . . . that receive the transfer gate signals TG1, TG2, . . . . Data stored in each memory cell array are furnished to the two adjacent sense amplifier arrays. For example, data in the left half of memory cell array 16-2 are furnished to sense amplifier array 18-2, and data in the right half of memory cell array 16-2 to sense amplifier array 18-3.

The transfer of data from the memory cell arrays to the sense amplifier arrays is controlled by the transfer gate signals. When memory cell array 16-2 is selected, for example, transfer gate signals TG3 and TG4 must be activated to enable transfer of data from memory cell array 16-2 to sense amplifier arrays 18-2 and 18-3, while transfer gate signals TG2 and TG5 must be deactivated to disable transfer of data from memory cell arrays 16-1 and 16-3 to those same sense amplifiers. For that reason, decoder 10-2 supplies selection signal S2 to transfer gate drivers 12-2, 12-3, 12-4, and 12-5 in FIG. 2. Similarly, decoder 10-3 supplies selection signal S3 to transfer gate drivers 12-4, 12-5, 12-6, and 12-7, and so on.

Figure 3:
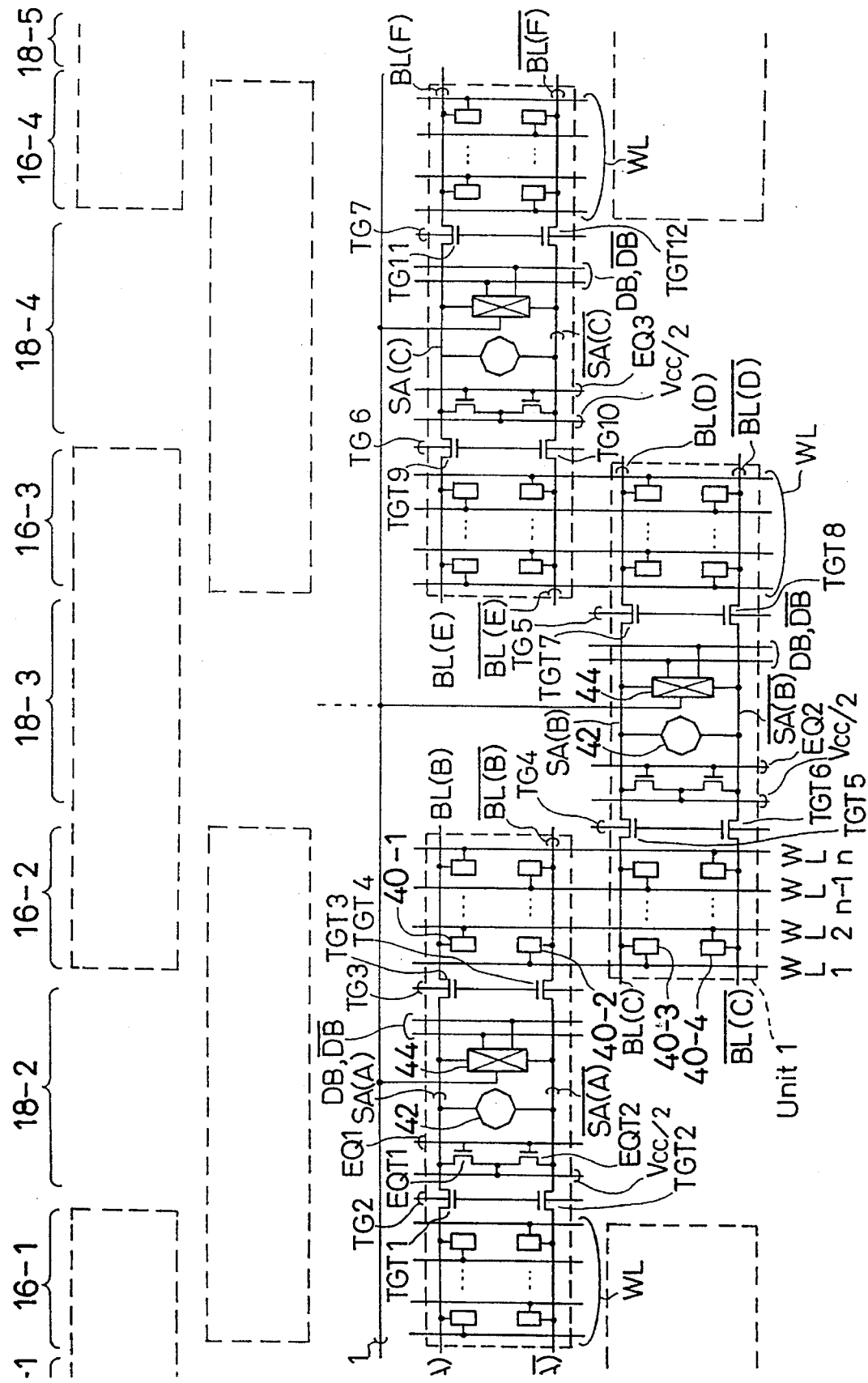
FIG. 3 is a schematic diagram illustrating part of the semiconductor memory in FIG. 1.

FIG. 3 is a schematic diagram showing part of the matrix 1 in FIG. 1 for the case of dynamic random access memory cells. Memory cell array 16-2 comprises memory cells 40-1, 40-2, . . . , which are coupled to word lines WL1, WL2, . . . , WLn-1, WLn. Each memory cell is also coupled to a bit line; four of the bit lines in the second memory cell array 16-2 are designated BL(B), $\overline{BL(B)}$, BL(C), and $\overline{BL(C)}$. Bit line BL(B) is coupled through an NMOS transistor TGT3 to a sense amplifier line SA(A) in the second sense amplifier array 18-2. Sense amplifier line SA(A) is coupled through another NMOS transistor TGT1 to a bit line BL(A) in memory cell array 16-1. Similarly, bit line $\overline{BL(B)}$ is coupled via an NMOS transistor TGT4 to a sense amplifier line $\overline{SA(A)}$, which is coupled via an NMOS transistor TGT2 to a bit line $\overline{BL(A)}$ in memory cell array 16-1.

Coupled between the sense amplifier lines SA(A) and $\overline{SA(A)}$ in the sense amplifier array 18-2 are a sense amplifier 42 that amplifies potential differences between the sense amplifier lines, a transfer circuit 44 that switchably couples the sense amplifier lines SA(A) and $\overline{SA(A)}$ to a pair of data bus lines DB and $\overline{DB}$, and a pair of NMOS transistors EQT1 and EQT2 that couple the sense amplifier lines SA(A) and $\overline{SA(A)}$ to a Vcc/2 line, which supplies a potential of Vcc/2. The gates of transistors EQT1 and EQT2 are driven by an EQ1 signal line, the transfer circuit 44 is activated by an activating signal CL1, the gates of transistors TGT1 and TGT2 are driven by the TG2 signal indicated in FIG. 2, and the gates of transistors TGT3 and TGT4 are driven by the TG3 signal indicated in FIG. 2. The sense amplifier 42 is activated by another signal, which is not indicated in the drawing.

Figure 4:
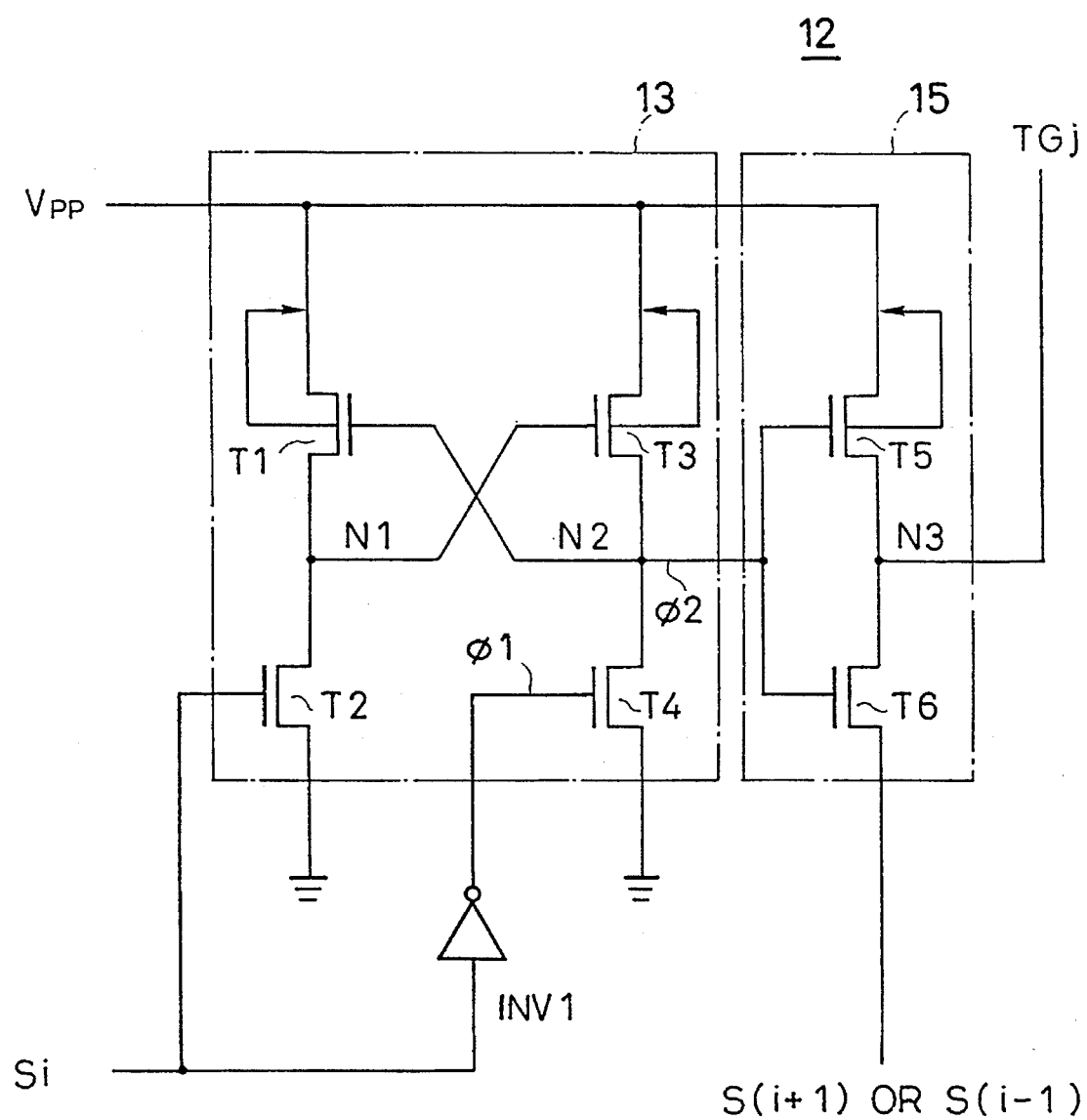
FIG. 4 is a schematic diagram of a novel transfer gate driver.

FIG. 4 illustrates the novel structure of the transfer gate drivers 12-1, 12-2, . . . in FIG. 2. Each of these circuits receives two selection signals Si and S(i−1), or Si and S(i+1), and generates a transfer gate signal TGj. The circuit has three parts: an inverter INV1 that receives selection signal Si and inverts it to generate a complementary signal $\phi1$; a level shifter 13 that converts Si, which takes values of Vcc and Vss, to a control signal $\phi2$ taking values of Vpp and Vss; and an output circuit 15 that receives $\phi2$ and generates a transfer gate signal TGj.

The level shifter 13 comprises PMOS transistors T1 and T3 and NMOS transistors T2 and T4. The source of PMOS transistor T1 is coupled to the Vpp line, its drain is coupled to a node N1, and its gate is coupled to a node N2. The source of NMOS transistor T2 is coupled to Vss, its drain is coupled to node N1, and its gate receives the selection signal Si. The source of PMOS transistor T3 is coupled to Vpp, its drain is coupled to node N2, and its gate is coupled to node N1. The source of NMOS transistor T4 is coupled to Vss, its drain is coupled to node N2, and its gate receives $\phi1$ from inverter INV1. Control signal $\phi2$ is taken from node N2.

The output circuit 15 comprises a PMOS transistor T5 and an NMOS transistor T6. The source of PMOS transistor T5 is coupled to Vpp, its drain is coupled to a node N3, and its gate receives $\phi2$ from node N2. The source of NMOS transistor T6 receives selection signal S(i+1) or S(i−1), its drain is coupled to node N3, and its gate receives $\phi2$ from node N2. The transfer gate signal TGj is taken from node N3.

The positional relationships of the input signals Si and S(i+1) or S(i−1) in FIG. 3 match the positional relationships in FIG. 2, the signal on the left being fed to NMOS transistor T2 and inverter INV1 while the signal on the right is fed to NMOS transistor T6. For example, in transfer gate driver 12-2, S1 goes to NMOS transistor T2 and inverter INV1, while S2 goes to NMOS transistor T6. In transfer gate driver 12-3 these relationships are reversed: S2 goes to NMOS transistor T2 and inverter INV1, while S1 goes to NMOS transistor T6.

Other selection signals cross over in similar manner. For example, in transfer gate driver 12-4 selection signal S3, which selects memory cell array 16-3, is coupled through transistor T6 to transfer gate signal TG4, which controls interconnection of memory cell array 16-2; and in transfer gate driver 12-5 selection signal S2, which selects memory cell array 16-2, is coupled through transistor T6 to transfer gate signal TG5, which controls interconnection of memory cell array 16-3.

To summarize the operation of the transfer gate drivers, in the standby state all the transfer gate signals are at the Vcc level, enabling all bit lines to be precharged to the Vcc/2 potential. During access to a particular memory cell array, the four transfer gate signals that control the two adjacent sense amplifier arrays are driven to different levels. Two of these transfer gate signals are raised to the Vpp level to enable data to be written or refreshed at the full Vcc level. The other two transfer gate signals are dropped to the Vss level to decouple the adjacent sense amplifier arrays from other memory cell arrays.

These operations will now be explained in more detail with reference to FIGS. 2, 3, 4, 5, and 6. It will be assumed that memory cell array 16-2 is accessed. Transfer gate signals TG3 and TG4 must accordingly be raised to the Vpp level, while TG2 and TG5 must be dropped to the Vss level. It will also be assumed that the access is to word line WL1 in FIG. 3, and causes writing or refreshing of a logic "one" in the two memory cells 40-2 and 40-3 marked with a stars.

Referring to FIG. 4, in the standby state the selection signals Si are all at the Vcc level. In each transfer gate driver, NMOS transistor T2 is on and NMOS transistor T4 is off, hence PMOS transistor T1 is off and PMOS transistor T3 is on, and node N2 is at the Vpp level. Accordingly, PMOS transistor T5 is off and NMOS transistor T6 is on and node N3 is at the same level as S(i+1) or S(i−1), namely the Vcc level. Since φ2 is at the Vpp level it is able to turn on NMOS transistor T6 even though the source potential of transistor T6 is Vcc, holding the transfer gate signals TGj all at the Vcc level.

Referring to FIG. 3, in the standby state signals EQ1, TG2, and TG3 are at the Vcc level, so transistors TGT1, TGT2, TGT3, TGT4, EQT1, and EQT2 are all turned on. Sense amplifier lines SA(A) and $\overline{SA(A)}$ and bit lines BL(A), $\overline{BL(A)}$, BL(B), and $\overline{BL(B)}$ are thereby precharged to Vcc/2. Similarly, signals EQ2, TG4, and TG5 are at the Vcc level, transistors TGT5, TGT6, TGT7, and TGT8 are turned on, and sense amplifier lines SA(B) and $\overline{SA(B)}$ and bit lines BL(C), $\overline{BL(C)}$, BL(D), and $\overline{BL(D)}$ are precharged to Vcc/2.

Figure 5:
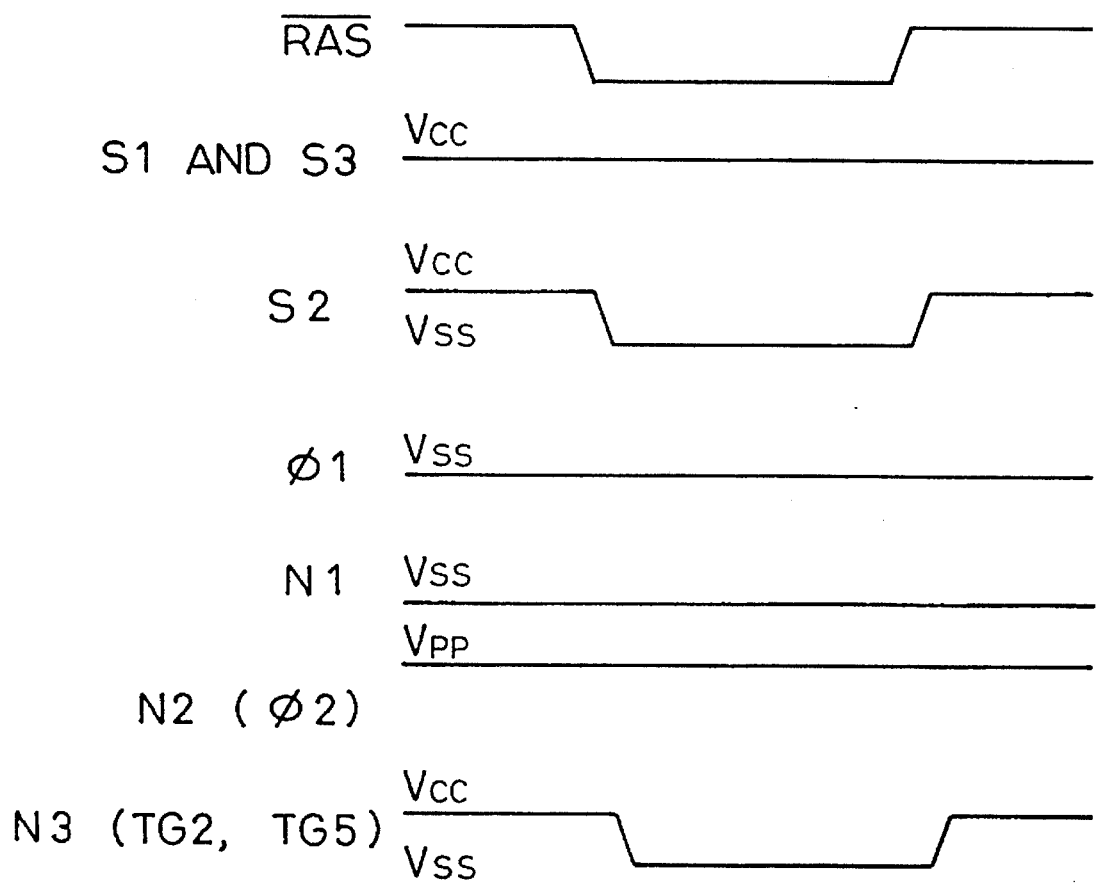
FIG. 5 is a voltage waveform diagram illustrating the operation of the driver in FIG. 4.
Figure 6:
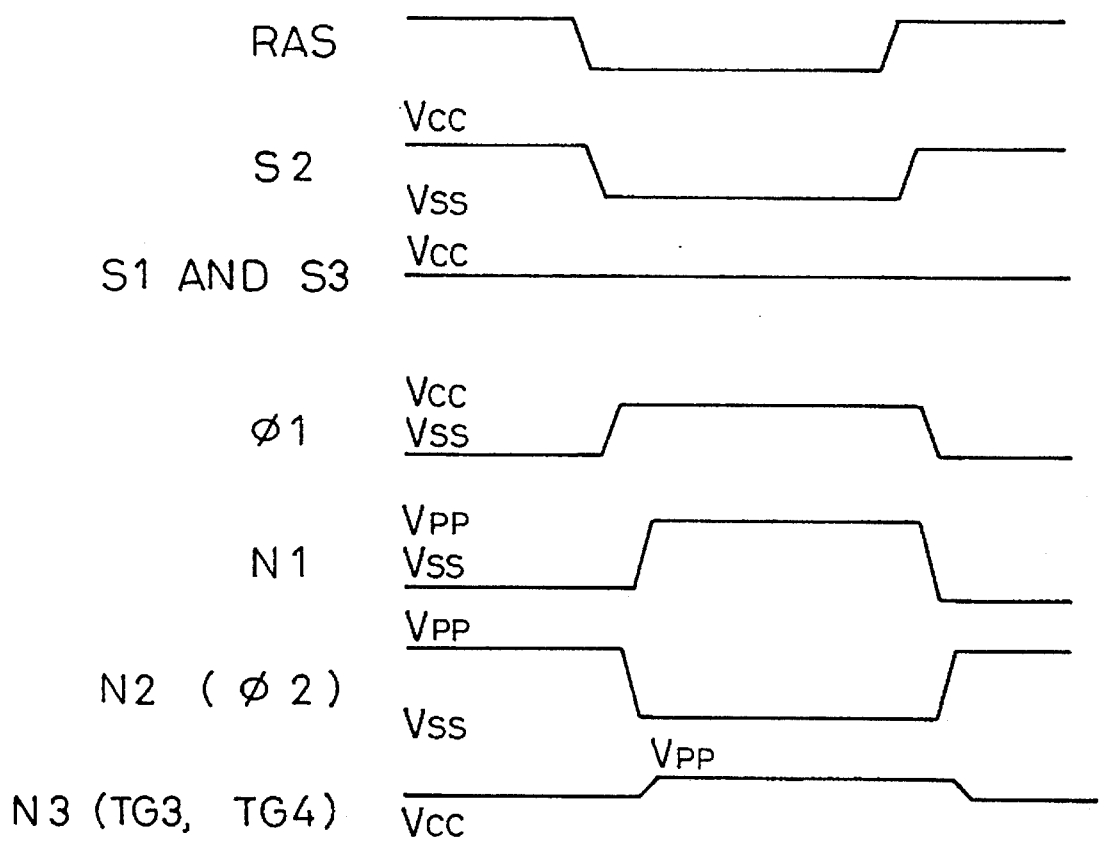
FIG. 6 is another voltage waveform diagram illustrating the operation of the driver in FIG. 4.

The standby state is illustrated at the left in FIGS. 5 and 6. During the access cycle an external row address strobe signal $\overline{RAS}$ goes low and a row address is decoded by the decoders 10-1, 10-2, . . . in FIG. 2, with the result that selection signal S2 goes to the Vss level while S1 and S3 remain at the Vcc level, as illustrated in the central part of FIGS. 5 and 6. In addition, word line WL1 in FIG. 3 is driven to the Vcc level to couple its connected memory cells to their respective bit lines, and equalizing signals EQ1 and EQ2 are driven to the Vss level to decouple the sense amplifier lines SA(A), $\overline{SA(A)}$, SA(B), and $\overline{SA(B)}$ from the Vcc/2 line.

Referring to FIGS. 4 and 5, in transfer gate drivers 12-2 and 12-5, which generate transfer gate signals TG2 and TG5, selection signal S2 is coupled through NMOS transistor T6 to node N3, while S1 or S3 is input to NMOS transistor T2 and inverter INV1. Since S1 and S3 remain at the Vcc level, φ1 stays at the Vss level, φ2 stays at the Vpp level, and all transistors remain on or off as in the standby state. Nodes 1 and 2 continue to be at the Vss and Vpp levels, respectively. Node 3 continues match the level of S2, but this level now falls to Vss. Transfer gate signals TG2 and TG5 therefore go to the Vss level, turning off transistors TGT1, TGT2, TGT7, and TGT8 in FIG. 3 and decoupling sense amplifier lines SA(A), $\overline{SA(A)}$, SA(B), and $\overline{SA(B)}$ from the bit lines BL(A), $\overline{BL(A)}$, BL(D), and $\overline{BL(B)}$ in memory cell arrays 16-1 and 16-3.

Referring to FIGS. 4 and 6, in transfer gate drivers 12-3 and 12-4, which generate transfer gate signals TG3 and TG4, selection signal S1 or S3 is coupled through NMOS transistor T6 to node N3, while S2 is input to NMOS transistor T2 and inverter INV1. When S2 drops to the Vss level, φ1 rises to Vss, with the result that NMOS transistor T2 turns off, NMOS transistor T4 turns on, PMOS transistor T1 turns on, PMOS transistor T3 turns off, node N1 changes to the Vpp level, and node N2 changes to the Vss level. The Vss level at node N2 turns PMOS transistor T5 on and NMOS transistor T6 off, so that node N3 is now coupled to Vpp and decoupled from S1 or S3. Node 3 accordingly goes to the Vpp level, taking with it the transfer gate signal TG3 or TG4.

Referring to FIG. 3, since transfer gate signals TG3 and TG4 are at the Vpp level, transistors TGT4 and TGT5 remain on while bit lines $\overline{BL(B)}$ and BL(C) rise all the way to the Vcc level. A logic "one" can thereby be written at the full Vcc level through transistors TGT4 and TGT5 into the memory cells 40-2 and 40-3.

On the right in FIGS. 5 and 6, at the end of the access cycle $\overline{RAS}$ goes high again, selection signal S2 returns to the Vcc level, nodes N1, N2, and N3 revert to their previous states, and transfer gate signals TG2, TG3, TG4, and TG5 return to the Vcc level. In addition, although not shown in the drawings, word line WL1 returns to the Vss level, decoupling its connected memory cells from the bit lines, and equalizer signals EQ1 and EQ2 go to the Vcc level to precharge the sense amplifier lines and bit lines to the Vcc/2 level in preparation for the next access cycle.

Since the transfer gate drivers shown in FIG. 4 do not have charge-pump capacitors, they are small in size and can be disposed close to the sense amplifier arrays, thereby reducing the resistance and capacitance of the transfer gate signal lines. Moreover, these transfer gate drivers do not have delay lines and are free of the timing problems that tend to occur in the prior art.

In the invention as just described, Vpp is supplied continuously to various transistors in the transfer gate drivers during both the standby and active states, even in cases when Vcc would suffice. Next a modification will be described that supplies Vpp more selectively.

Figure 7:
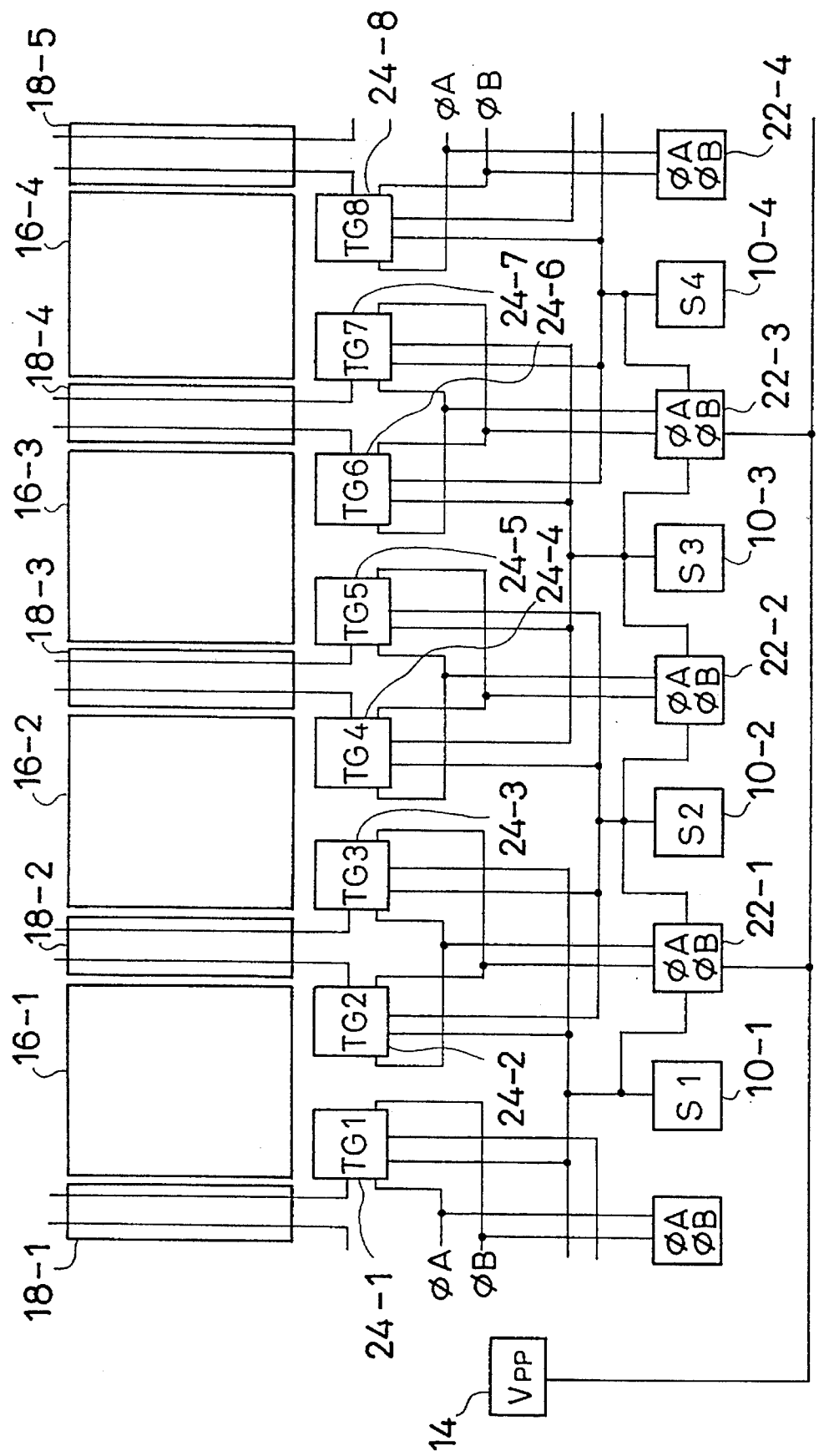
FIG. 7 is a block diagram illustrating a modification of the configuration shown in FIG. 2.

Referring to FIG. 7, this modification uses the same decoders 10-1, 10-2, . . . , Vpp source 14, memory cell arrays 16-1, 16-2, . . . , and sense amplifier arrays 18-1, 18-2, . . . as in FIG. 2. As before, the selection signals S1, S2, . . . are normally at the Vcc level, but go to the Vss level to select memory cell arrays.

The Vpp source 14 in FIG. 7 is coupled to a plurality of voltage pumping circuits 22-1, 22-2, . . . that also receive selection signals S1, S2, . . . from adjacent decoders 10-1, 10-2, . . . , and generate voltage signals φA and φB. Normally φA is at the Vcc level and φB at the Vpp level. When either of the two selection signals input to a voltage pumping circuit goes to the Vss level, the voltage pumping circuit raises its φA output to the Vpp level and drops its φB output to the Vss level. The detailed structure of these voltage pumping circuits will be described later.

The transfer gate drivers 24-1, 24-2, . . . , receive selection signals from the decoders 10-1, 10-2, . . . , and φA and φB from the voltage pumping circuits 22-1, 22-2, . . . . One voltage pumping circuit is provided for every two transfer gate drivers. The transfer gate drivers 24-1, 24-2, . . . generate transfer gate signals TG1, TG2, . . . that control transistors in the sense amplifier arrays 18-1, 18-2, . . . as before. The transfer gate drivers 24-1, 24-2, . . . do not receive Vpp directly from the Vpp source 14.

Figure 8:
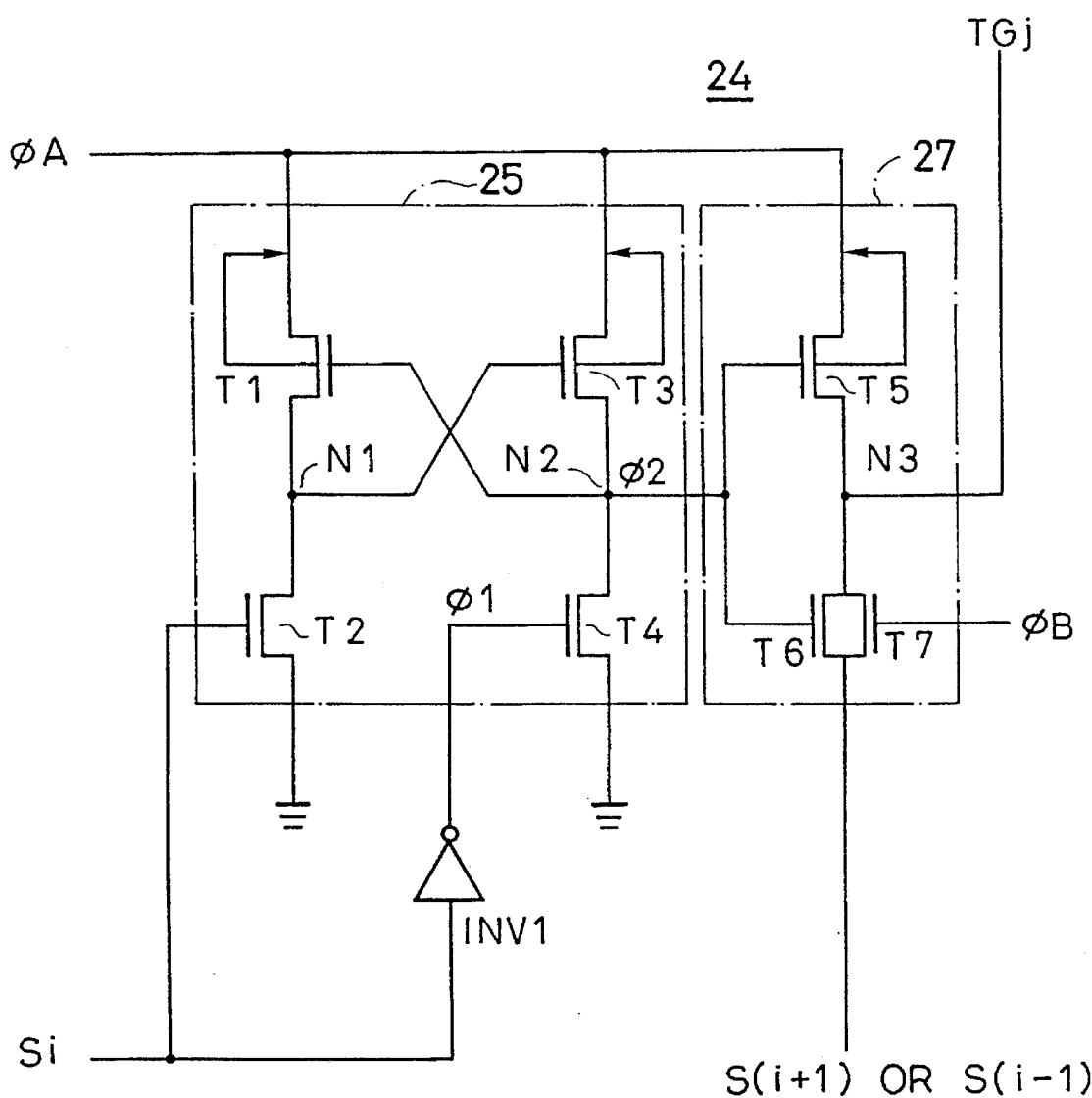
FIG. 8 is a schematic diagram of another novel transfer gate driver.

Referring to FIG. 8, the transfer gate drivers 24-1, 24-2, . . . have the same structure as in FIG. 2, comprising an inverter INV1, a level shifter 25, and an output circuit 27, with two differences. The first difference is that φA is supplied to PMOS transistors T1, T3, and T5 in place of Vpp. The second difference is that an additional NMOS transistor T7 is provided in the output circuit 27, paralleling NMOS transistor T6. The gate of NMOS transistor T7 is driven by φB.

The operation of this circuit will be described with reference to FIGS. 7, 8, 9, and 10. Referring to FIG. 8, in the standby state signals Si, S(i+1), S(i−1), and φA are all at the Vcc level, while φB is at the Vpp level. Transistors T2 and T3 are on while transistors T1, T4, and T5 are off. Transistor T6 is off because its gate and source are both at the Vcc level, but the gate of transistor T7 is at the Vpp level, so transistor T7 is on and the transfer gate signal TGj is at the same level as S(i+1) or S(i−1), namely the Vcc level.

In an access cycle, one of the selection signals goes to the Vss level, activating two of the voltage pumping circuits. For example, selection signal S2 goes to the Vss level, activating voltage pumping circuits 22-1 and 22-2 in FIG. 7, with the result that the φA outputs from these two circuits are raised to the Vpp level while their φB outputs drop to the Vss level. These changes affect transfer gate drivers 22-2, 22-3, 22-4, and 22-5. Since φB is supplied to the gate of NMOS transistor T7 in FIG. 8, in these four transfer gate drivers NMOS transistor T7 turns off.

Figure 9:
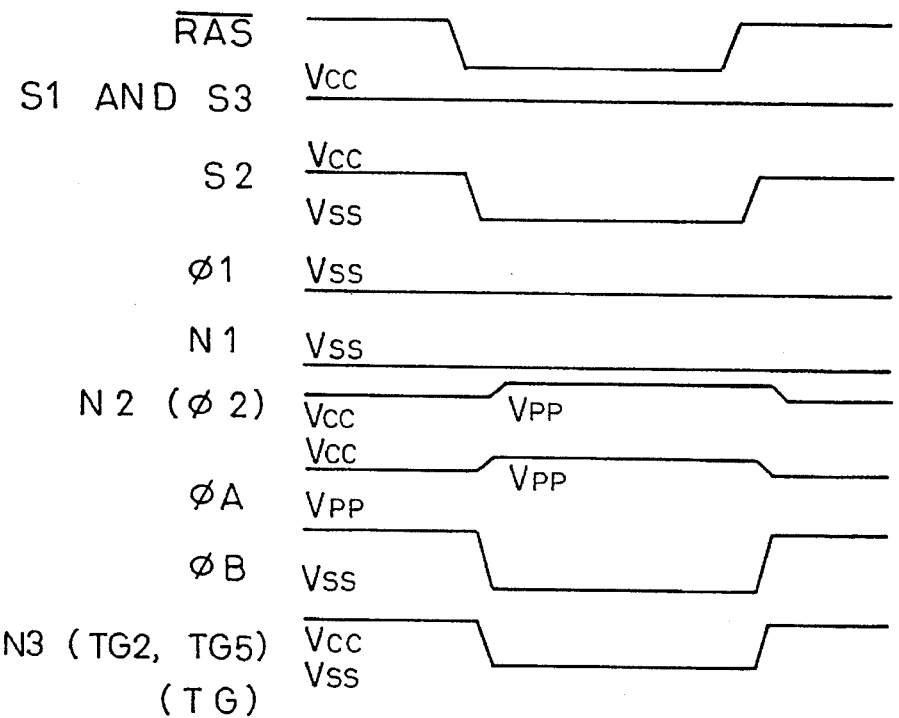
FIG. 9 is a voltage waveform diagram illustrating the operation of the driver in FIG. 8.

Referring to FIGS. 7 and 8, in transfer gate drivers 24-2 and 24-5, selection signal S2 is coupled through NMOS transistors T6 and T7 to node N3. Although NMOS transistor T7 is off because φB is at the Vss level, NMOS transistor T6 is turned on because φA is now at the Vpp level. Transfer gate signals TG2 and TG5 therefore drop with selection signal S2 to the Vss level as shown in FIG. 9.

Figure 10:
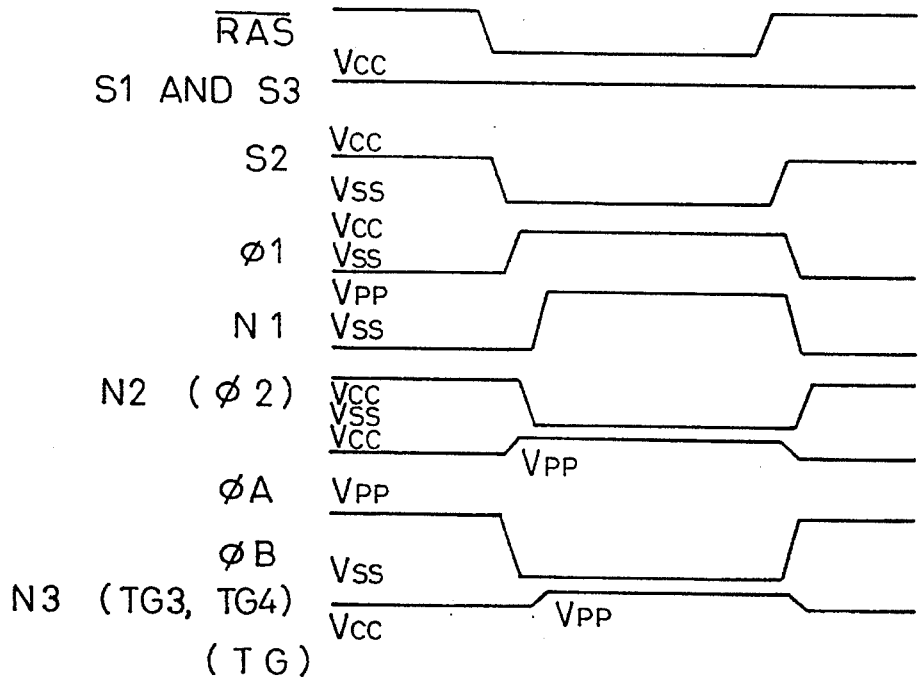
FIG. 10 is another voltage waveform diagram illustrating the operation of the driver in FIG. 8.

Referring again to FIGS. 7 and 8, in transfer gate drivers 24-3 and 24-4, selection signal S2 is applied to inverter INV1 and the gate of NMOS transistor T2. Accordingly, transistors T2, T3, and T6 turn off and transistors T1, T4, and T5 turn on. Since transistor T5 is on while transistors T6 and T7 are both off, node N3 goes to the φA level of Vpp. Transfer gate signals TG3 and TG4 therefore rise to the Vpp level as shown in FIG. 10.

At the end of the access cycle, S2 returns to the Vcc level. This causes φA to return to the Vcc level and φB to the Vpp level, and the standby state resumes, with all transfer gate signals at the Vcc level.

The circuits shown in FIGS. 7 and 8 accordingly control the transfer gate signals in the same way as the circuits in FIGS. 2 and 4. Next the structure of the voltage pumping circuits 22-1, 22-2, ... will be described.

Figure 11:
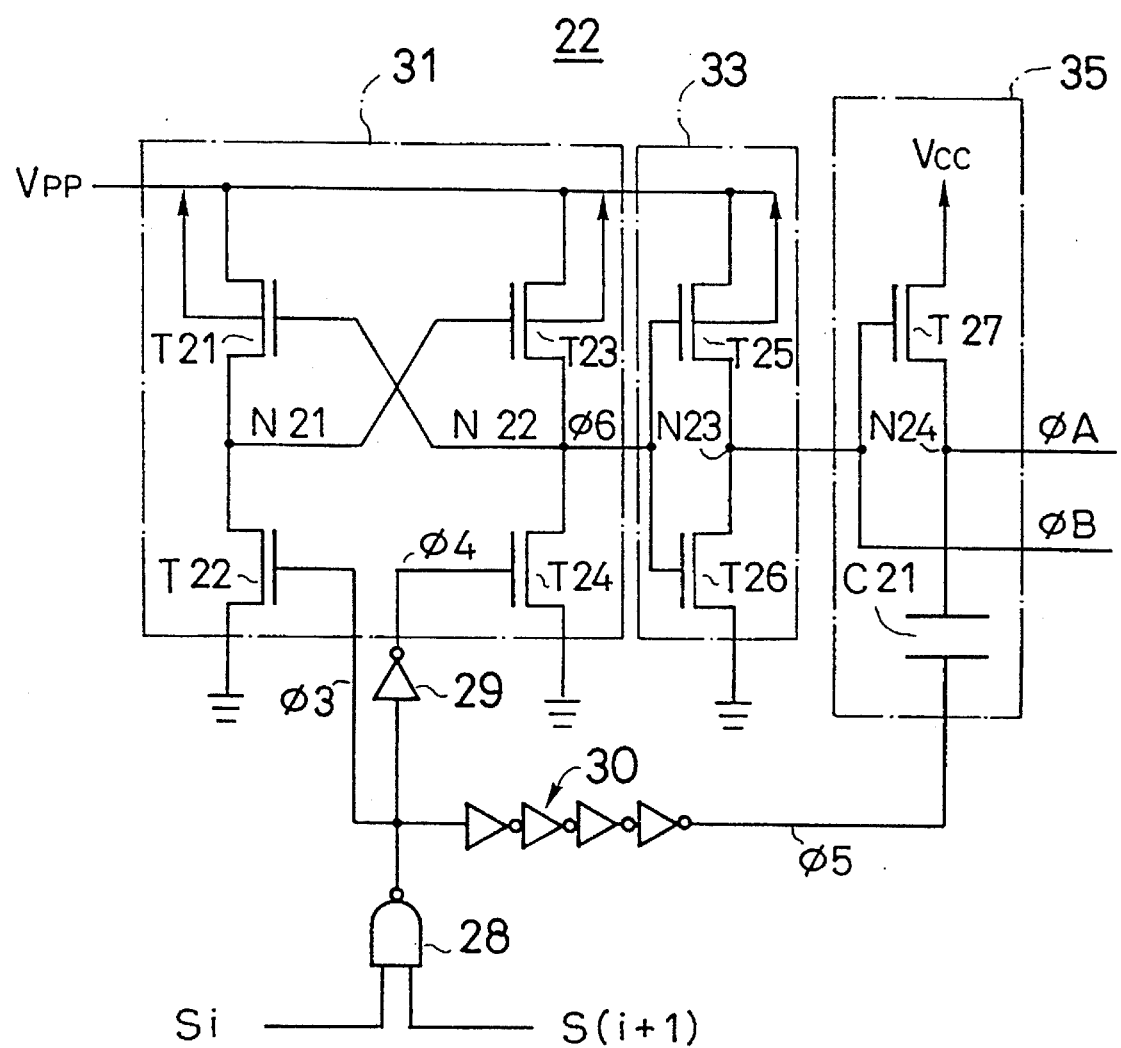
FIG. 11 is a schematic diagram of a novel voltage pumping circuit.

Each of the voltage pumping circuits 22-1, 22-2, ... has the structure shown in FIG. 11, comprising a NAND gate 28, an inverter 29, an inverter chain 30, a level shifter 31, a Vpp inverter 33, and a charge pump 35.

The NAND gate 28 receives two selection signals Si and S(i+1) and performs a NOT AND logical operation on them to generate a control signal φ3. The inverter 29 inverts φ3 to generate a complementary signal φ4. The inverter chain 30 inverts φ3 four times to generate a signal φ5, which is identical to φ3 with a certain delay.

The level shifter 31 comprises PMOS transistors T21 and T23 and NMOS transistors T22 and T24. The source of PMOS transistor T21 is coupled to Vpp, its drain is coupled to a node N21, and its gate is coupled to a node N22. The source of NMOS transistor T22 is coupled to Vss, its drain is coupled to node N21, and its gate receives control signal φ3 from the NAND gate 28. The source of PMOS transistor T23 is coupled to Vpp, its drain is coupled to node N22, and its gate is coupled to node N21. The source of NMOS transistor T24 is coupled to Vss, its drain is coupled to node N22, and its gate receives signal φ4 from inverter 29. The output from node N22 is a control signal φ6.

The Vpp inverter 33 comprises a PMOS transistor T25 and an NMOS transistor T26. The source of PMOS transistor T25 is coupled to Vpp, its drain is coupled to a node N23, and its gate receives φ6 from node N22. The source of NMOS transistor T26 is coupled to Vss, its drain is coupled to node N23, and its gate also receives φ6 from node N22. Voltage signal φB is taken from node N23.

The charge pump 35 comprises an NMOS transistor T27 and a capacitor C21. The source of NMOS transistor T27 is coupled to Vcc, its drain is coupled to a node N24, and its gate receives φB from node N23. Capacitor C21 is coupled in series between node N24 and the inverter chain 30. One plate of capacitor C21 accordingly receives φ5 from the inverter chain 30, while the other plate receives Vcc through transistor T27 when transistor T27 is turned on. Voltage signal φA is taken from node N24.

Figure 12:
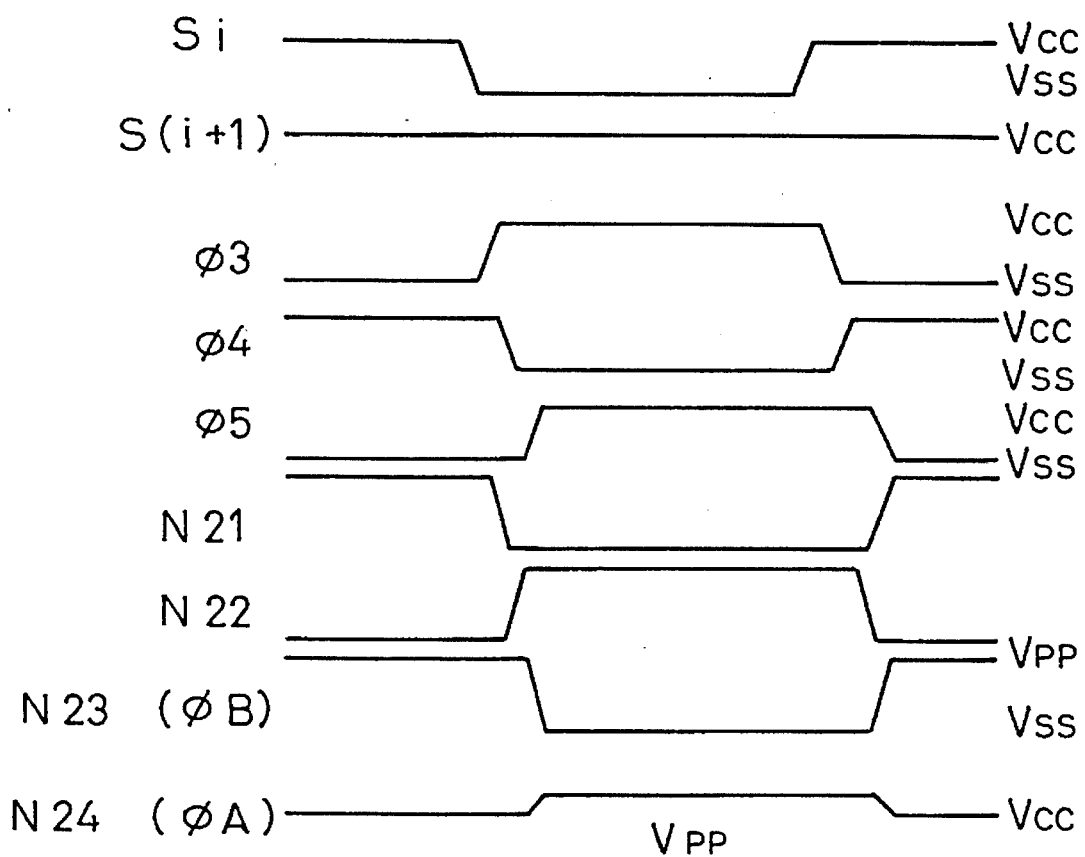
FIG. 12 is a voltage waveform diagram illustrating the operation of the circuit in FIG. 11.

The operation of the circuit in FIG. 11 will be explained with reference to FIG. 12. In the standby state Si and S(i+1) are both at the Vcc level, as indicated at the left in FIG. 12, so φ3 is at the Vss level, φ4 is at the Vcc level, and φ5 is at the Vss level. In the level shifter 31 transistors T21 and T24 are on and transistors T22 and T23 are off, so node N22 and control signal φ6 are at the Vss level. In the Vpp inverter 33, PMOS transistor T25 is on and NMOS transistor T26 is off, so node N23 is at the Vpp level. In the charge pump 35 NMOS transistor T27 is on, so node N24 is at the Vcc level. Voltage signal φA is therefore at the Vcc level, while voltage signal φB is at the Vpp level. Capacitor C21 is charged to the voltage difference between node N24 (Vcc) and the output of the inverter chain 30 (Vss).

When the i-th or (i+1)-th memory cell array is selected and selection signal Si or S(i+1) goes to the Vss level, the φ3 signal output by NAND gate 28 goes to the Vcc level. After a brief delay the signal φ4 output by inverter 29 goes to the Vss level. After a slightly longer delay the signal φ5 output by the inverter chain 30 goes to the Vcc level. In the level shifter 31 and Vpp inverter 33, the transistors that were on turn off, and the transistors that were off turn on. Node N21 goes to the Vss level. Node N22 and φ6 go to the Vpp level. Node N23 and φB go to the Vss level. NMOS transistor T27 therefore turns off, and node N24 is pumped up to the Vcc output level of the inverter chain 30 plus the voltage across capacitor C21, raising the level of φA.

The voltage level achieved by φA depends on the relative capacitance of capacitor C21 and the load to which φA is coupled, including the stray capacitance of signal lines and the like. If capacitor C21 has sufficient capacitance, the achieved voltage level will exceed Vcc by an amount greater than the NMOS transistor threshold voltage. Accordingly, the level reached by φA can be denoted Vpp, as it was in FIGS. 9 and 10, although this Vpp is not necessarily identical to the Vpp input to the circuit in FIG. 11.

By requiring only one voltage pumping circuit for every two transfer gate drivers, the memory illustrated in FIGS. 7 to 11 cuts the number of charge-pump capacitors in half as compared with the prior art. Moreover, with the circuit configuration in FIG. 11 there is no danger of direct current flow from Vcc to Vss.

Referring again to FIG. 8, when a transfer gate signal TGj is to be raised to the Vpp level, it is not necessary for φB to fall all the way to Vss. This is the case in which signal Si in FIG. 8 goes to the Vss level while S(i+1) and S(i−1) remain at the Vcc level, so to turn off transistor T7 it suffices to reduce φB to the Vcc level. The voltage pumping circuits 22-1, 22-2, ... can therefore be modified as shown in FIG. 13 by supplying Vcc to the source of NMOS transistor T26.

Figure 13:
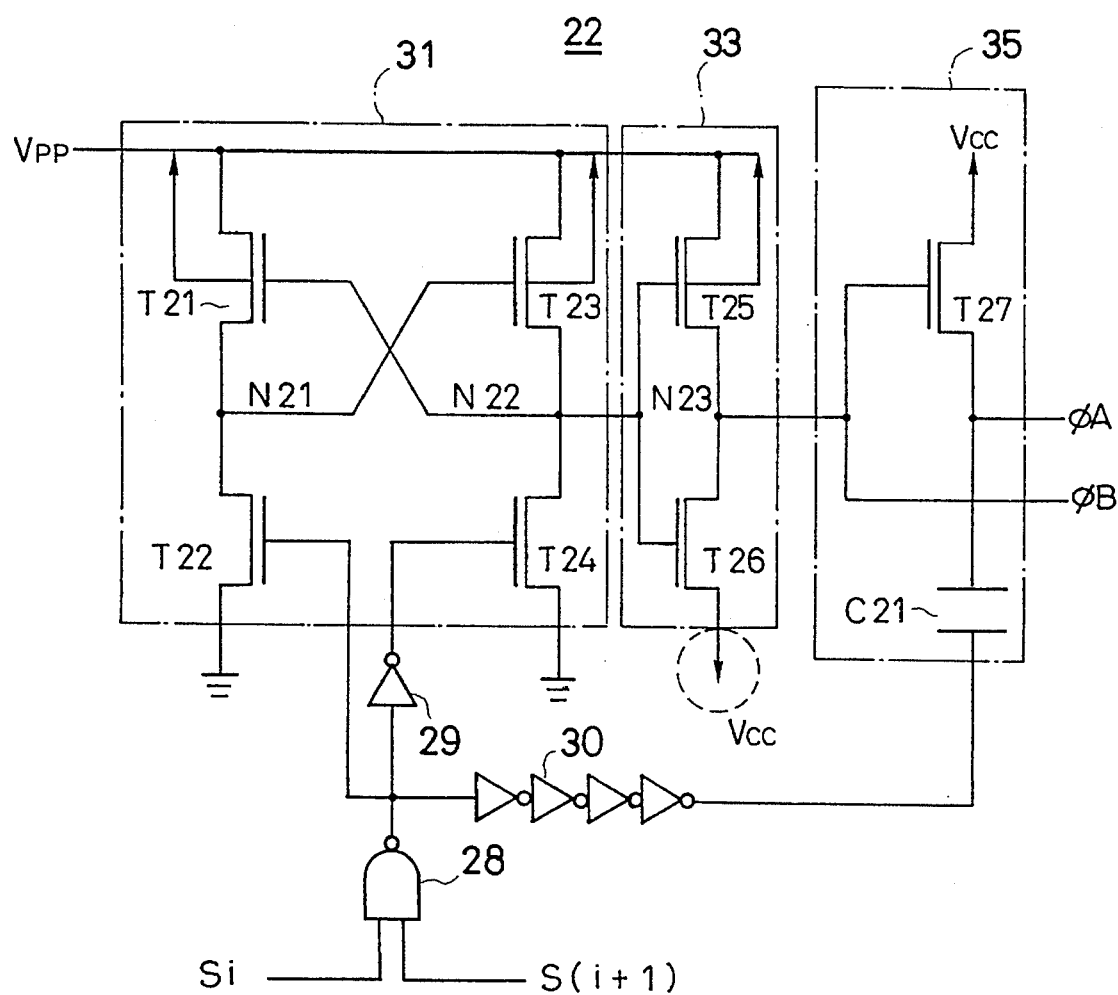
FIG. 13 is a schematic diagram of a modified voltage pumping circuit.

Aside from this single modification, FIG. 13 is identical to FIG. 11. The circuit in FIG. 13 operates identically to that in FIG. 11 except that when Si or S(i+1) goes to Vss, node N23 and φB change from Vpp to Vcc. The source and gate of NMOS transistor T27 are both at Vcc, so its gate-source voltage is zero volts and it turns off.

The advantage of the circuit configuration in FIG. 13 is that, since φB now varies only between Vpp and Vcc, less charge is lost when φB changes level. The amount of charge (Q) saved in this way is:

$$Q = C\phi B \times Vcc \times n$$

where CφB is the capacitance of the load to which voltage signal φB is coupled and n is the number of voltage pumping circuits activated per access cycle.

Those skilled in the art will notice various further modifications that can be made to the circuits in the drawings without departing from the scope of the invention as set forth in the following claims. In FIG. 11, for example, since nodes N21 and N23 are always at the same level, the Vpp inverter 33 can be omitted, and node N21 can be coupled to φB and the gate of NMOS transistor T27.

What is claimed is:

1. A semiconductor memory comprising:

a sense amplifier line;

a sense amplifier coupled to said sense amplifier line;

a bit line to which a voltage of approximately a voltage supply level is applied in a first period and to which a voltage of approximately one-half of said voltage supply level is applied in a second period;

a plurality of memory cells coupled to said bit line;

a transfer gate transistor coupled between said sense amplifier line and said bit line, said transfer gate transistor having a threshold voltage and being operated in response to a transfer gate signal; and a transfer gate drive circuit coupled to said transfer gate transistor for generating said transfer gate signal having the voltage supply level in the second period and having a boosted voltage level which is approximately equal to or larger than an amount of the voltage supply level and the threshold voltage level.

2. A semiconductor memory according to claim 1, wherein said transfer gate drive circuit comprises:

a level shift circuit supplied with the boosted voltage supply level, the level shift circuit generating a level shift signal in response to a first selection signal; and an output circuit supplied with the boosted voltage supply level, the output circuit receiving the level shift signal and a second selection signal which has the voltage supply level or a ground level, the output circuit outputting the transfer gate signal in response to the level shift signal and the second selection signal.

3. A semiconductor memory according to claim 2, wherein the level shift circuit generates the level shift signal having either the boosted potential level or the ground level.

4. A semiconductor memory according to claim 2, wherein the output circuit outputs the transfer gate signal having the boosted potential level when the level shift signal has the ground level and outputs the second selection signal as the transfer gate signal when the level shift signal has the boosted potential level.

5. A semiconductor memory according to claim 2, wherein the output circuit comprises:

a first transistor having a gate receiving the level shift signal, a source applied to the boosted potential level and a drain; and a second transistor having a gate receiving the level shift signal, a source receiving the second selection signal and a drain coupled to the drain of the first transistor.

6. A semiconductor memory comprising:

a sense amplifier line;

a sense amplifier coupled to said sense amplifier line;

a bit line to which a voltage of approximately a voltage supply level is applied in a first period and to which a voltage of approximately one-half of said voltage supply level is applied in a second period;

a plurality of memory cells coupled to said bit line;

a transfer gate transistor coupled between said sense amplifier line and said bit line, said transfer gate transistor having a threshold voltage and being operated in response to a transfer gate signal;

a transfer gate drive circuit coupled to said transfer gate transistor for generating said transfer gate signal having the voltage supply level in the second period and having a boosted voltage level which is approximately equal to or larger than an amount of the voltage supply level and the threshold voltage level; and a transfer gate drive control circuit coupled to said transfer gate drive circuit for generating first and second drive control signals, the first control signal having the boosted voltage level.

7. A semiconductor memory according to claim 6, wherein said transfer gate drive circuit comprises:

a level shift circuit receiving the first drive control signal and a first selection signal, the level shift circuit generating a level shift signal in response to the first selection signal; and an output circuit receiving the first and second drive control signals, the level shift signal and a second selection signal which has the voltage supply level or a ground level and outputting the transfer gate signal.

8. A semiconductor memory according to claim 7, wherein the level shift circuit generates the level shift signal having either the boosted potential level or the ground level.

9. A semiconductor memory according to claim 7, wherein the output circuit outputs the transfer gate signal having the boosted potential level when the level shift signal has the ground level and the first drive control signal has the boosted potential level, and outputs the second selection signal as the transfer gate signal when the level shift signal has the boosted potential level.

10. A semiconductor memory according to claim 7, wherein the output circuit comprises:

a first transistor having a gate receiving the level shift signal, a source receiving the first drive control signal and a drain; and a second transistor having a gate receiving the level the shift signal, a source receiving the second selection signal and a drain coupled to the drain of the first transistor.

11. A semiconductor memory according to claim 10, wherein the output circuit further comprises a third transistor having a gate receiving the second drive control signal, a source receiving the second selection signal and a drain coupled to the drain of the first transistor.

* * * * *